(12) United States Patent
Nakamichi

(10) Patent No.: US 6,518,845 B2
(45) Date of Patent: Feb. 11, 2003

(54) PLL FREQUENCY SYNTHESIZER CIRCUIT

(75) Inventor: Hiroto Nakamichi, Satsuma (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/809,221

(22) Filed: Mar. 16, 2001

(65) Prior Publication Data

US 2002/0008586 A1 Jan. 24, 2002

(30) Foreign Application Priority Data

Jul. 21, 2000 (JP) ........................................ 2000-221087

(51) Int. Cl.[7] ................................................ H03L 7/00
(52) U.S. Cl. ................................. 331/16; 331/DIG. 2
(58) Field of Search ......................... 331/16, 17, DIG. 2

(56) References Cited

U.S. PATENT DOCUMENTS 5,892,405 A * 4/1999 Kamikubo et al. ......... 331/1 A
6,121,844 A * 9/2000 Suzuki ........................ 331/17

FOREIGN PATENT DOCUMENTS

| JP | 2-113726 | 4/1990 |
| JP | 4-297128 | 10/1992 |
| JP | 8-307254 | 11/1996 |
| JP | 9-214338 | 8/1997 |

* cited by examiner

*Primary Examiner*—Robert Pascal
*Assistant Examiner*—Joseph Chang
(74) *Attorney, Agent, or Firm*—Arent Fox Kintner Plotkin & Kahn, PLLC

(57) ABSTRACT

A voltage-controlled oscillator outputs a signal of a frequency controlled by a voltage of an input signal, the output signal being used for feedback as an internal change signal. A phase comparator detects a phase difference between the internal change signal and an external reference signal. A charge pump outputs the signal having the voltage based on the phase difference to the voltage-controlled oscillator via a low-pass filter. The charge pump is controlled so that the voltage of the signal input to voltage-controlled oscillator becomes a voltage for oscillating a lock frequency. When instruction of changing the lock frequency is input, and/or a phase inversion of the internal change signal used for feedback in a locking-up operation rendered in response to the instructions is detected, a control is made such that an absolute value of an output current of the charge pump is increased.

3 Claims, 7 Drawing Sheets

PLL FREQUENCY SYNTHESIZER CIRCUIT

BACKGROUND OF THE INVENTION

1. Field of the Invention

The present invention relates to a frequency synthesizer circuit employing a local oscillating circuit and a PLL (Phase Locked Loop), and, in particular, a PLL frequency synthesizer circuit in which a locking-up time at a time of lock frequency switching is shortened.

2. Description of the Related Art

FIGS. 1, 2 and 3 illustrate such a PLL frequency synthesizer circuit in the related art.

FIG. 1 is a block diagram showing a PLL frequency synthesizer circuit in the related art. FIG. 2 is a timing chart of an operation of the PLL frequency synthesizer circuit shown in FIG. 1. FIG. 3 illustrates a locking-up operation of the PLL frequency synthesizer circuit shown in FIG. 1.

As shown in the figures, the PLL frequency synthesizer circuit in the related art includes a phase comparator 1 which calculates a phase difference between a reference frequency fr output after undergoing frequency dividing from a reference frequency divider 6 and a comparing frequency fp output after undergoing frequency dividing from a comparing frequency divider 7, and outputs phase-difference signals PP and PR based on the thus-calculated phase difference, a charge pump 2 which outputs an output current Do specified based on the phase-difference signals PP and PR, a low-pass filter 3 generates a direct-current control voltage Vc based on this output current Do, and removes unnecessary frequency components included in the output current Do, a voltage-controlled oscillator (VCO) 4 which generates a oscillated frequency fvco based on the direct-current control voltage Vc, and a pre-scaler 5 which renders frequency dividing on the oscillated frequency fvco into a predetermined frequency fpin and outputs the-thus-obtained frequency-divided frequency fpin to the comparing frequency divider 7.

The reference frequency divider 6 generates the reference frequency fr based on a reference clock signal fc generated by a quarz-crystal oscillating circuit 61 based on an externally input instruction signal OSCin, and a frequency-dividing value signal and a counter-setting signal STBR generated by a shift register 71. The comparing frequency divider 7 generates the comparison frequency fp from the frequency-divided frequency fpin output from the pre-scaler 5 and the frequency-dividing value signal and counter-setting signal STBP output from the shift register 71. The shift register 71 has a clock signal CLOCK, a data signal DATA and a control signal LE input externally thereto, generates the frequency-dividing value signal from the clock signal CLOCK and data signal DATA, and, also, based on the control signal LE, generates the counter-setting signals STBR and STBP which control taking in and storing of the frequency-dividing value signal by the reference frequency divider 6 or comparing frequency divider 7.

The locking-up operation at the time of lock-frequency switching of the PLL frequency synthesizer circuit having the above-described configuration will now be described. First, at the time of T1 (FIG. 2), both the reference frequency fr of the reference frequency divider 6 and the comparison frequency fp of the comparing frequency divider 7 are locked to one another at a coincident lock frequency fvco1, and the phase-difference signals PP and PR output from the phase comparator 1 do not have pulse widths indicating a phase difference. When no phase difference is detected by the phase comparator 1, the phase-difference signals output are merely of impulses (shown in FIG. 2 as vertical lines) and do not have pulses having pulse widths indicating a phase difference.

When the counter-setting signal STBP for changing the frequency-dividing value is output to the comparing frequency divider 7 from the shift register 71 in order that the lock frequency is to be changed (channel switching) from fvco1 into fvco2 (fvco1<fvco2) at the time T2 in the above-mentioned locked condition, the locking-up operation is started. The locking-up operation is an operation in that the phase comparator 1 compares the reference frequency fr with the comparison frequency fp after the counter-setting signal STBP is input, the phase difference corresponding to the delay of the comparison frequency fp is calculated, and the phase-difference signals PP and PR are output based on the thus-obtained phase difference.

In the beginning of the locking-up operation immediately after the change from the lock frequency fvco1, the phase-difference signal PP having the increasing frequency is output with the pulse width corresponding to the above-mentioned phase difference. This phase-difference signal PP is input to the charge pump 2, and the charge pump 2 outputs the output current Do for the time corresponding to the above-mentioned phase-different signal PP. This output current Do is converted into the direct-current control voltage Vc by the low-pass filter 3, and, based on this direct-current control voltage Vc, the VCO 4 converts this voltage value into a frequency, and outputs the oscillated frequency fvco of an internal change signal. As shown in FIG. 3, this oscillated frequency fvco undergoes feedback control by a PLL circuit of a closed loop including the phase comparator 1, charge pump 2, low-pass filter 3, voltage-controlled oscillator 4, pre-scalar and comparing frequency divider 7 so that the frequency is increased from the original lock frequency fvco1.

When the above-mentioned oscillated frequency fvco is increased so that the phase between the reference frequency fr and comparison frequency fp is inverted at the time T30 (first phase inversion), the phase comparator 1 outputs the phase-difference signal PR for decreasing the frequency with the pulse width corresponding to the phase difference obtained through the calculation. This phase-difference signal PR is input to the charge pump 2, and the charge pump 2 outputs the output current Do for the time corresponding to the phase-difference signal PR. This output current Do is converted into the direct-current control voltage Vc by the low-pass filter 3, and, based on the direct-current control voltage Vc, the VCO 5 outputs the oscillated frequency fvco.

This oscillated frequency fvco is controlled by the above-mentioned PLL circuit so that the frequency is decreased, as shown in FIG. 3. When the oscillated frequency fvco is thus decreased, and the phase is again inverted (second phase inversion) at the time T40, the above-mentioned operation is repeated, and, thereby, the frequency fvco changes so that the amplitude of overshooting becomes smaller and the frequency converges into the lock frequency fvco2, the target frequency of the channel switching.

Because the PLL frequency synthesizer circuit in the related art is configured as described above, the overshooting occurs when the vibration condition is repeated and the frequency converges into the target lock frequency since the counter-setting signal STBP for the channel switching is output to the comparing frequency divider 7, and, thereby, shifting into the target lock frequency cannot be rendered smoothly, and, thus, the locking-up time is long.

PLL frequency synthesizer circuits are disclosed in Japanese Laid-Open Patent Applications Nos. 2-113726, 4-297128, 8-307254 and 9-214338.

The PLL frequency synthesizer circuit disclosed in Japanese Laid-Open Patent Application No. 2-113726 renders shortening of the locking-up time by controlling the output current of the charge pump by changing connection of a plurality of external resistors. However, the S/N ratio (ratio of signal to noise) is degraded and also the C/N ratio (ratio of carrier to noise) is degraded when the capability of the charge pump is increased. Thereby, the characteristics (for exmaple, PLL loop gain) differs between the steady locked condition and locking-up condition, and, as a result, a relocking phenomena may occur.

The PLL frequency synthesizer circuit disclosed in Japanese Laid-Open Patent Application No. 4-297128 is such that the driving current of the charge pump is variable correspondingly to the phase difference (output pulse width) output from the phase comparator, occurrence of phase deviation at the time of switching is prevented, and the starting-up speed can be increased. However, because the driving current corresponds to the phase difference (output pulse width), overshooting in the locking-up waveform is large, and, thereby, the locking-up time is rather long.

The PLL frequency synthesizer circuit disclosed in Japanese Laid-Open Patent Application No. 8-307254 is such that the output of the charge pump having the variable gain is increased (or decreased) when the phase difference at the time of locking up is large (or small). Thereby, when the phase difference is large, large overshooting occurs, and re-locking phenomena may occurs. Accordingly, it is not possible to shorten the locking-up time consequently.

SUMMARY OF THE INVENTION

An object of the present invention is to solve the above-mentioned problem, and, to provide a PLL frequency synthesizer circuit in which, without change in characteristics in steady locked condition, the locking-up time can be shortened, and, also, the S/N ratio can be prevented from being degraded.

A PLL frequency synthesizer circuit, according to the present invention, comprises:

a voltage-controlled oscillator outputting a signal of a frequency controlled by a voltage of an input signal, the output signal being used for feedback as an internal change signal;

a phase comparator detecting a phase difference between the internal change signal and an external reference signal; and a charge pump outputting via a low-pass filter the signal having the voltage based on the phase difference to the voltage-controlled oscillator;

wherein the charge pump is controlled so that the voltage of the signal input to voltage-controlled oscillator becomes a voltage for oscillating a lock frequency, and wherein, when an instruction of changing the lock frequency (channel switching) is input, and/or a phase inversion of the internal change signal used for feedback in a locking-up operation rendered in response to the instruction is detected, a control is made such that an absolute value of an output current of the charge pump is increased.

Thus, according to the present invention, during an interval from the time the changing instruction is input to the time the above-mentioned phase inversion is detected, and/or during an interval from the phase inversion and a subsequent phase inversion, the phase comparator detects the phase inversion based on the phase difference, the charge pump outputs the output current with the absolute value thereof thus increased for at least an arbitrarily set number of times from the first time of the times of the thus-detected phase inversions. Thereby, it is possible to shorten the locking-up time Without changing the characteristics of the steady locked condition, and, also, to prevent the S/N ratio from being degraded.

The number of times the charge pump outputs the output current with the absolute value thereof thus increased during the interval from the time the changing instruction is input to the time the phase inversion is detected, and/or during the interval from the phase inversion and a subsequent phase inversion, may be set arbitrarily, as the necessary arises. Thereby, according to the present invention, as a result of the number of times the charge pump outputs the output current with the absolute value thereof increased during the interval between phase inversions being able to be set arbitrarily, it is possible to control overshooting in the locking-up waveform and to shorten the locking-up time without degrading the S/N ratio.

During the interval from the time the changing instruction is input to the time the phase inversion is detected, and/or during the interval from the phase inversion and the subsequent phase inversion, the phase comparator detects the phase inversion based on the phase difference, the charge pump outputs the output current with the absolute value thereof thus increased for at least an arbitrarily set number of times from the first time of the times of the thus-detected phase inversions, as the necessity arises. Thus, according-to the present invention, because a control is made such that the charge pump outputs the output current with the absolute value thereof thus increased for at least an arbitrarily set number of times from the first time of the times of the thus-detected phase inversions detected by the phase comparator, the PLL feedback control amount at the beginning of rise of vibration in the locking-up waveform is increased, and, also, the feedback control amount is decreased in the latter part of times the phase difference is detected in comparison to the feedback control amount in the former part. Thereby, it is possible to control overshooting in the locking-up waveform, and, thus, to shorten the locking-up time without degrading the S/N ratio.

A current value by which the absolute value of the output current of the charge pump is thus increased may be arbitrarily set, as the necessity arises. Thereby, according to the present invention, it is possible to shorten the locking-up time more positively without degrading the S/N ratio.

Other objects and further features of the present invention will become more apparent from the following detailed description when read in conjunction with the accompanying drawings.

DETAILED DESCRIPTION OF THE PREFERRED EMBODIMENT

Figure 4:
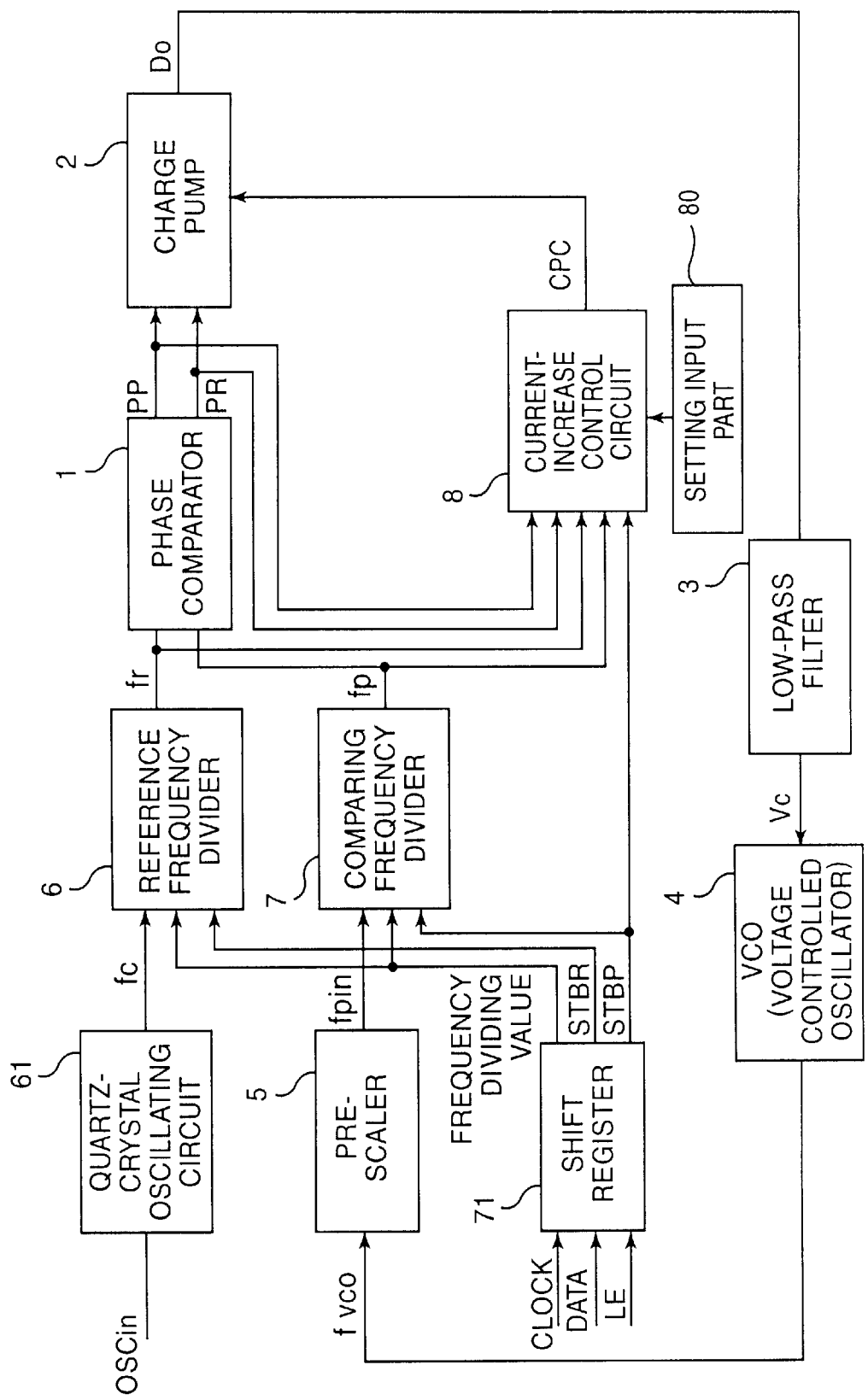
FIG. 4 is an entire block diagram showing a PLL frequency synthesizer circuit in one embodiment of the present invention.
Figure 5:
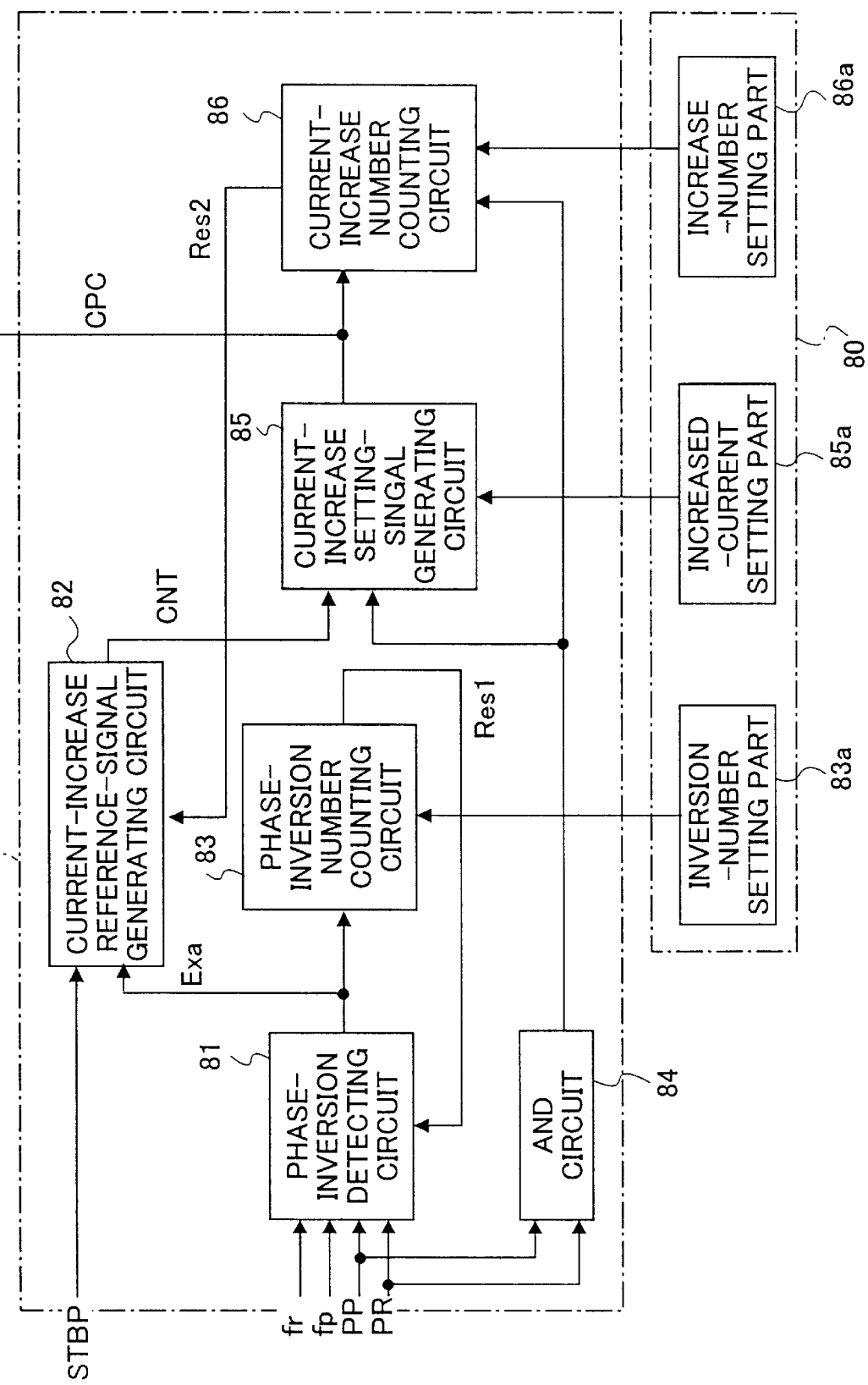
FIG. 5 is a block diagram showing a current-increase control circuit shown in FIG. 4.
Figure 6:
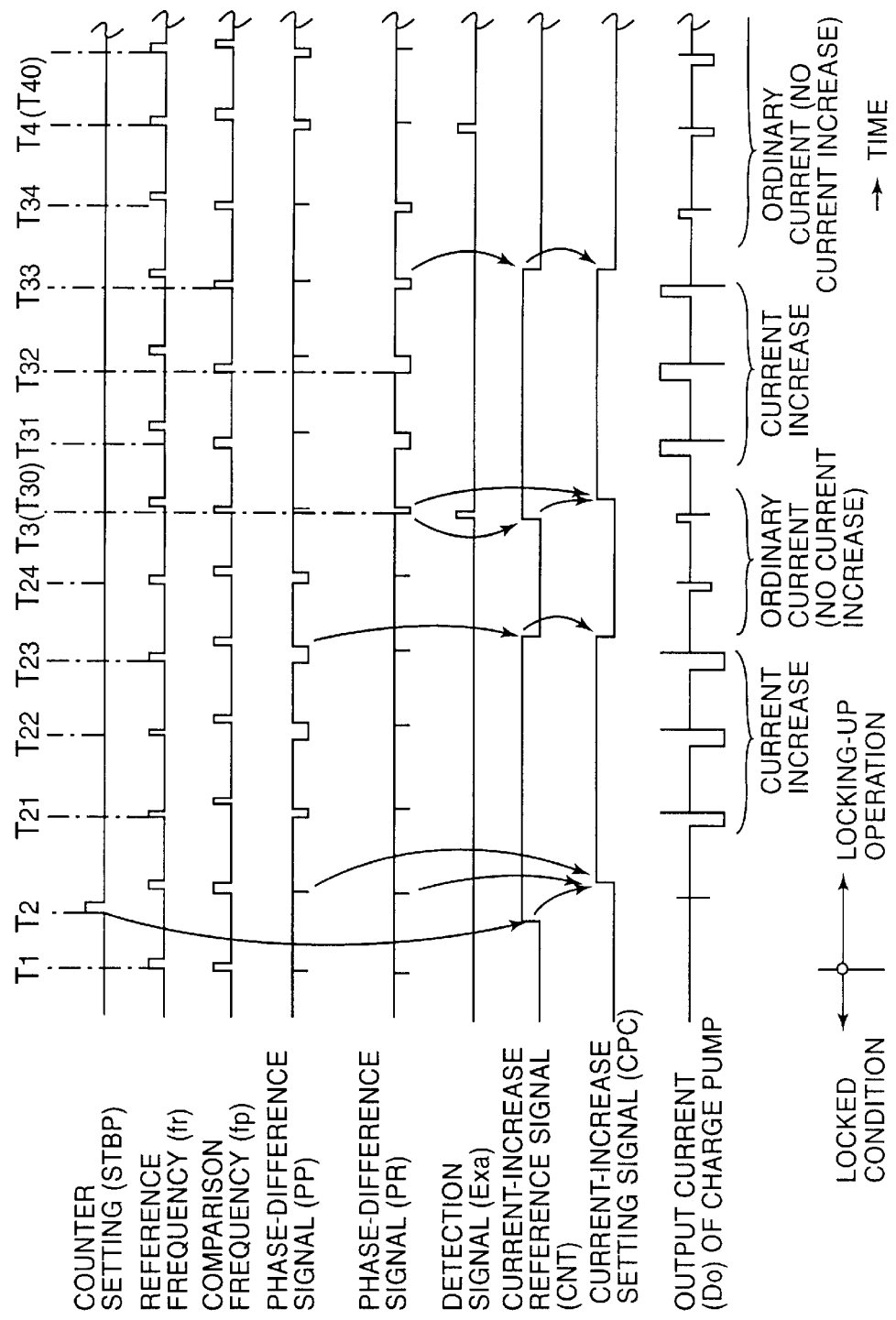
FIG. 6 is a timing chart of operation of the PLL frequency synthesizer circuit shown in FIG. 4.
Figure 7:
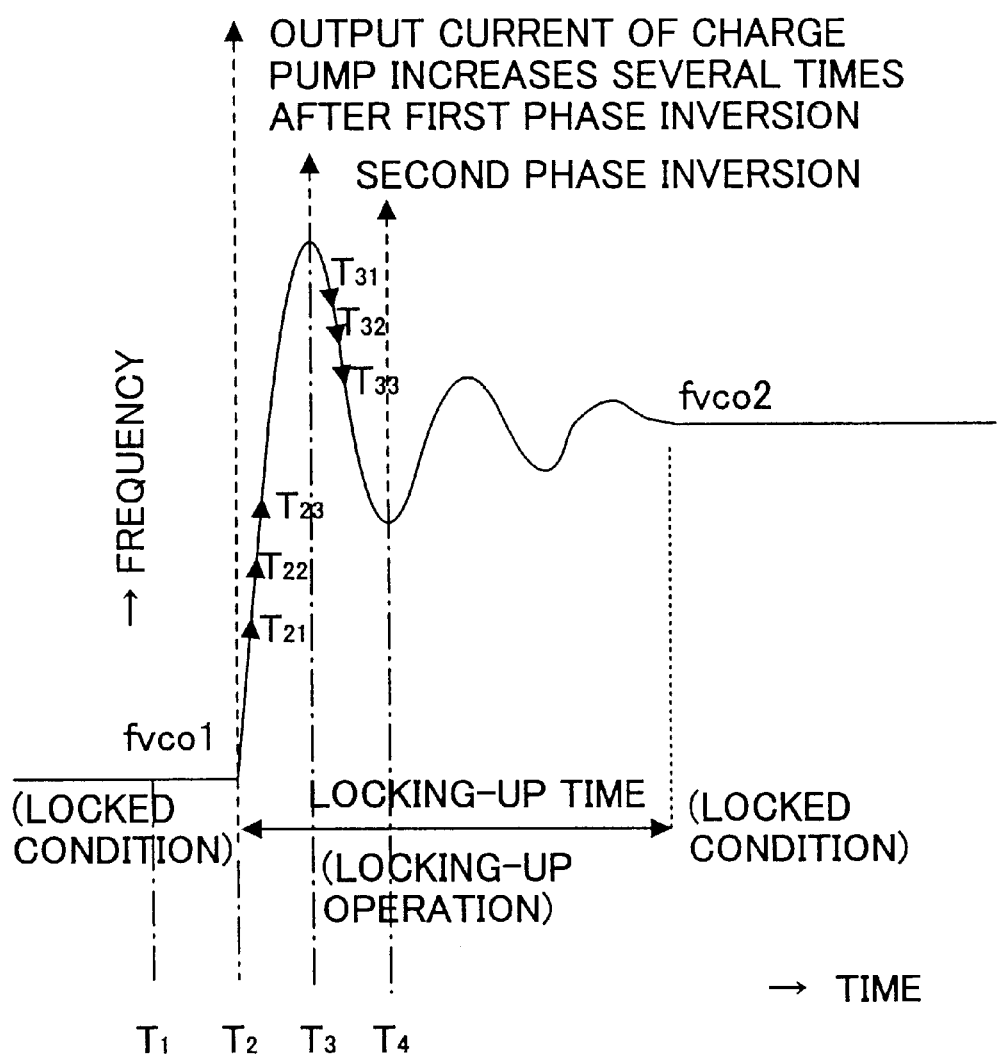
FIG. 7 illustrates the locking-up operation of the PLL frequency synthesizer circuit shown in FIG. 4.

A PLL frequency synthesizer circuit in one embodiment of the present invention will now be described with reference to FIGS. 4, 5, 6 and 7. FIG. 4 is an entire-circuit block diagram showing the PLL frequency synthesizer circuit in the embodiment of the present invention. FIG. 5 is a detailed block diagram showing a current-increase control circuit in the PLL frequency synthesizer circuit shown in FIG. 4. FIG. 6 is a timing chart showing operation of the PLL frequency synthesizer circuit shown in FIG. 4. FIG. 7 illustrates a locking-up operation of the PLL frequency synthesizer circuit shown in FIG. 4.

Figure 1:
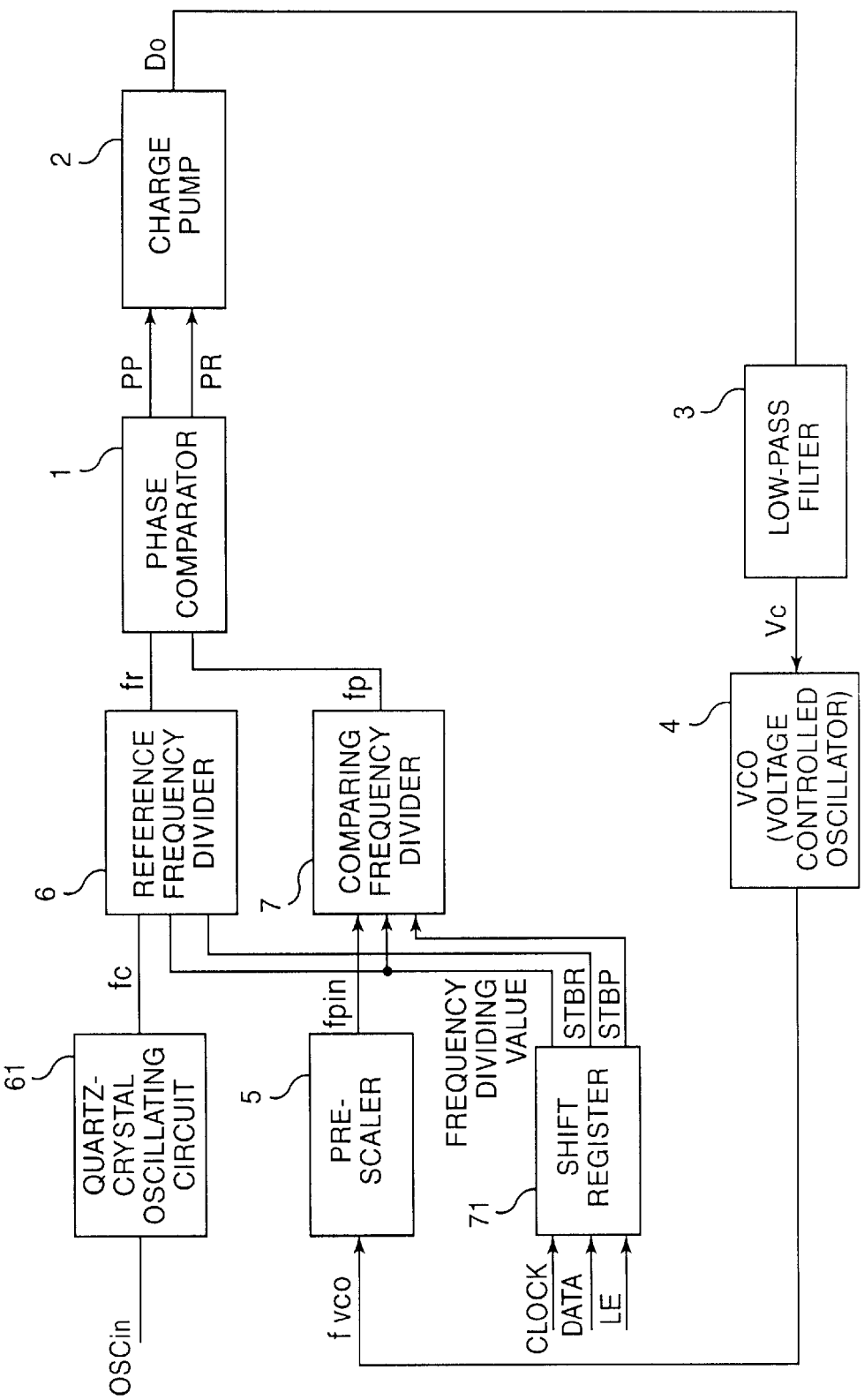
FIG. 1 is a block diagram showing a PLL frequency synthesizer circuit in the related art.

As shown in the figures, the PLL frequency synthesizer circuit in the embodiment of the present invention includes the phase comparator 1, charge pump 2, low-pass filter 3, voltage-controlled oscillator 4, pre-scaler 5, reference frequency divider 6, comparing frequency divider 7, quarz-crystal oscillating circuit 61 and shift register 71 same as those of the PLL frequency synthesizer circuit in the related art shown in FIG. 1. The PLL frequency synthesizer circuit in the embodiment of the present invention further includes a current-increase control circuit 8 which causes the absolute value of the output current output from the charge pump 2 to increase either when the counter-setting signal STBP is output from the shift register 71 or when phase inversion in a locking-up waveform is detected based on the phase-difference signals PP and PR output from the phase comparator 1.

This current-increase control circuit 8 includes (FIG. 5) a phase-inversion detecting circuit 81 which has the reference frequency fr from the reference frequency divider 6, the comparison frequency fp from the comparing frequency divider 7 and the phase-difference signals PP and PR from the phase comparator 1 input thereto, and, based on these signals, detects phase inversion in the locking-up waveform, and outputs a detection signal Exa, a current-increase reference-signal generating circuit 82 which, based on the detection signal Exa output from the phase-inversion detecting circuit 81 or the counter-setting signal STBP from the shift register 71, generates a current-increase reference signal CNT, which is used as a reference signal of increasing the output current Do by the charge pump 2, a phase-inversion number counting circuit 83 which counts the number of times of output of the detection signal Exa from the phase-inversion detecting circuit 81 each time this signal is output, and outputs a reset signal Res1 to the phase-inversion detecting circuit 81 when the count value has reached a previously set number, an AND circuit 84 which obtains a logical-product condition of the phase-difference signals PP and PR, a current-increase setting-signal generating circuit 85 which generates a current-increase setting signal CPC for increasing the output current of the charge pump 2 based on the logical product output from the AND circuit 84 and the current-increase reference signal CNT from the current-increase reference-signal generating circuit 82, and a current-increase number counting circuit 86 which counts the number of times of current increase based on the current-increase setting signal CPC and the logical product output from the AND circuit 84, and generates a reset signal Res2 resetting the generating operation of the current-increase reference-signal generating circuit 82 when the count value has reached a previously set number.

A setting input part 80 is connected to the current-increase control circuit 8, and includes an inversion number setting part 83a which sets the above-mentioned previously set number of the phase-inverson number counting circuit 83, an increased-current setting part 85a which sets a current-increase rate of the current-increase setting signal CPC generated by the current-increase setting-signal generating circuit 85, and an increase-number setting part 86a which sets the above-mentioned previously set number of the current-increase number counting circuit 86.

The locking-up operation at a time of switching of lock frequency in the PLL frequency synthesizer circuit in the embodiment of the present invention described above will now be described (see FIGS. 6 and 7). First, similar to the PLL frequency synthesizer circuit in the related art described above, at the time T1, both the reference frequency fr of the reference frequency divider 6 and the comparison frequency fp of the comparing frequency divider 7 are a coincident lock frequency fvco1, thus, the PLL frequency synthesizer circuit is in the locked condition, and the phase-difference signals PP and PR output from the phase comparator 1 are not ones having a predetermined pulse width. These phase-difference signals are ones merely having impulses and not ones having the pulse width indicating a phase difference, in a case where no phase difference is detected.

Then, when the counter-setting signal STBP for changing the frequency-dividing value is output from the shift register 71 to the current-increase reference-signal generating circuit 82 of the current-increase control circuit 8 and the comparing frequency divider 7 in order that the lock frequency is to be changed (channel switching) from fvco1 into fvco2 (fvco1<fvco2) at the time T2 in the above-mentioned locked condition, the locking-up operation is started. Immediately after the beginning of the locking-up operation, the current-increase reference-signal generating circuit 82, based on the counter-setting signal STBP, generates the current-increase reference signal CNT in its ON state which acts as a reference signal of increasing the output current Do of the charge pump 2, and outputs the thus-generated signal to the current-increase setting-signal generating circuit 85.

Further, the AND circuit 84 of the current-increase control circuit 8 obtains the logical-product condition of the phase-difference signals PP and PR, and outputs the logical product to the current-increase setting-signal generating circuit 85. The current-increase setting-signal generating circuit 85, based on the thus-input current-increase reference signal CNT and logical product, generates the current-increase setting signal CPC corresponding to the current-increasing rate set by the increased-current setting part 85a at the time T21, and outputs the thus-generated signal to the charge pump 2. After the counter-setting signal STBP is input as mentioned above, the phase comparator 1 compares the reference frequency fr with the comparison frequency fp, calculates the phase difference corresponding to the delay of the comparison frequency fp, and, based on the phase difference, outputs the phase-difference signals PP and PR.

The charge pump 2 has the phase-difference signals PP and PR input thereto, generates the output current Do based on the increased current specified by the current-increase setting signal CPC and the time specified by the above-mentioned pulse width of the phase-difference signals PP and PR, as shown in FIG. 4, and controls the voltage-controlled oscillator 4 via the low-pass filter 3 by the output current Do. Feedback control is rendered by the above-mentioned PLL circuit for the oscillated frequency fvco output from the voltage-controlled oscillator 4, and, at the times T22 and T23, the phase difference is calculated by the phase comparator 1, and, when the phase-difference signal PP is output based on this phase difference, the current-increase setting signal CPC is generated by the current-increase setting-signal generating circuit 85 similarly to the case at the time T21. The feedback control by the PLL circuit is rendered during the interval from the time T2 to the time T23 shown in FIG. 7.

The number of times of the feedback control at the times T21, T22 and T23 based on the current-increase setting signal CPC is counted by the current-increase number counting circuit 86, and, when the thus-obtained count value has reached the previously set number (for exmaple, three times) set by the increase-number setting part 86a, the reset signal Res2 is output to the current-increase reference-signal generating circuit 82. The current-increase reference-signal generating circuit 82, when having the reset signal Res2 input thereto, causes the current-increase reference signal CNT to be in its OFF state, and the feedback control of the PLL circuit by the cur-rent-increase setting signal CPC is not rendered until the phase inversion is detected by the phase-inversion detecting circuit 81 and the detection signal Exa is output therefrom.

Figure 2:
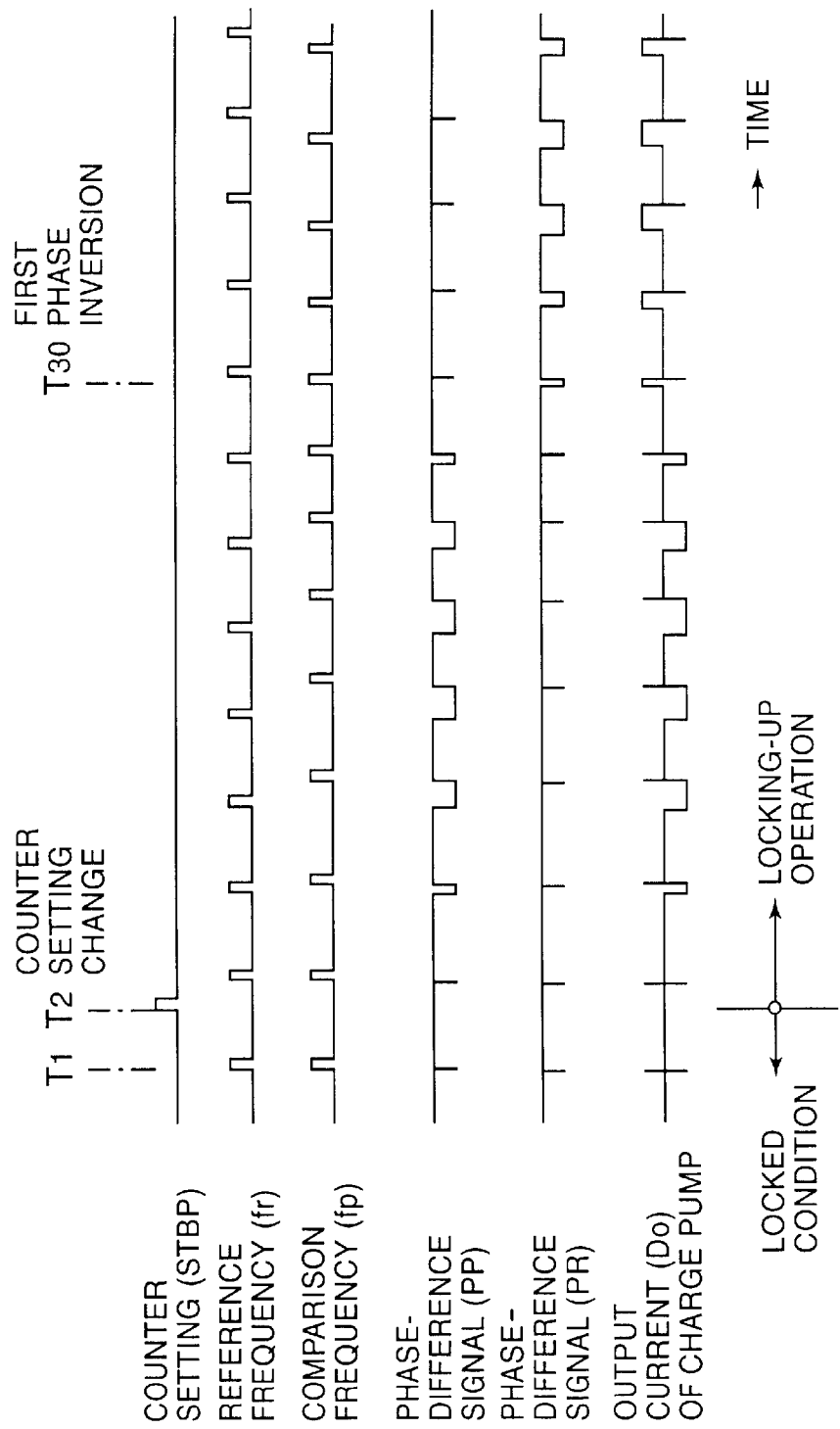
FIG. 2 is a timing chart of operation of the PLL frequency synthesizer circuit shown in FIG. 1.
Figure 3:
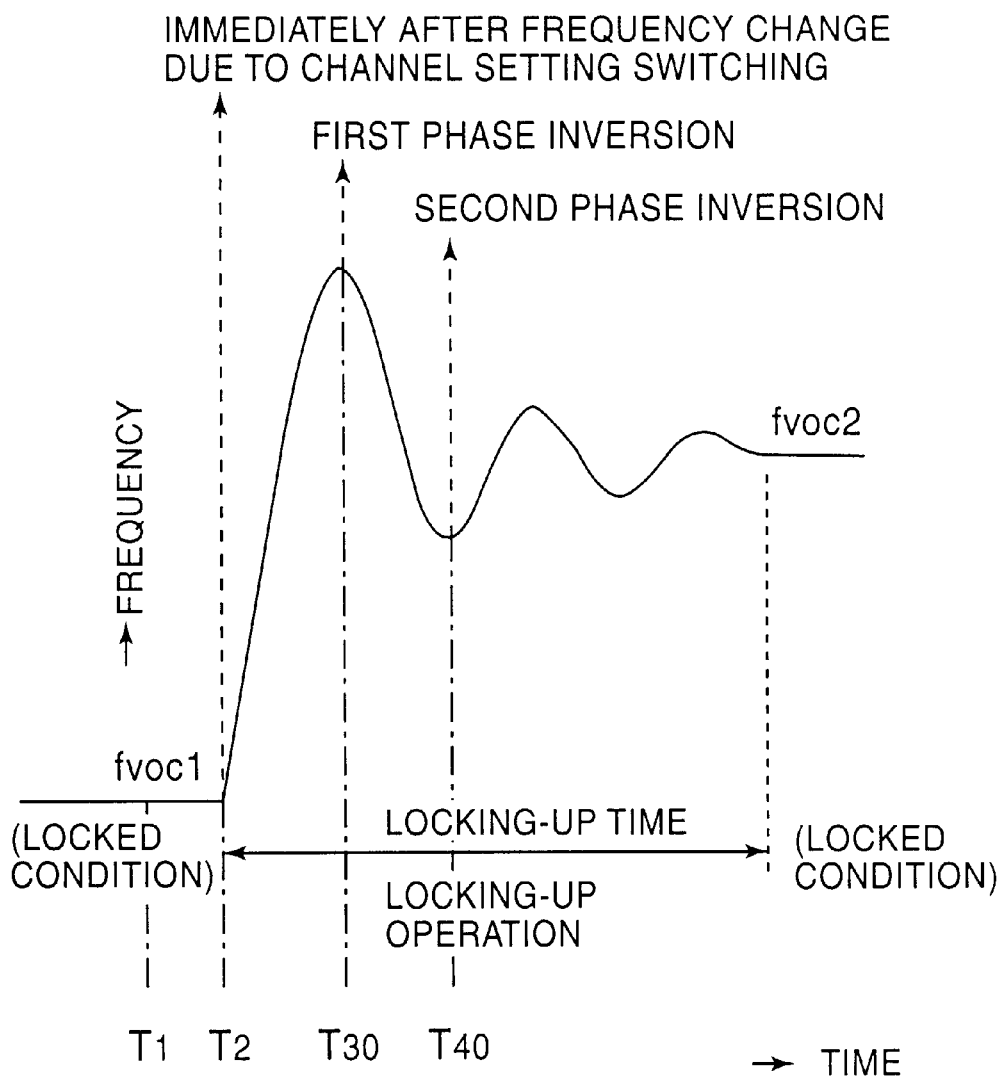
FIG. 3 illustrates a locking-up operation of the PLL frequency synthesizer circuit shown in FIG. 1.

During the interval from the time T24 after the time T23 to the time T3 at which the first phase inversion is detected by the phase-inversion detecting circuit 81, the locking-up operation similar to that of the PLL frequency synthesizer circuit in the related art shown in FIGS. 1, 2 and 3 is rendered. Thus, the feedback operation by the current-increase setting signal CPC is rendered only at the times in the former phase-difference detection up to the third time at the beginning of the feedback control, and, at the fourth and fifth times in the latter phase-difference detection, the output current of the charge pump 2 is produced by the phase-difference signals PP and PR of the phase comparator 1 not by the increased current of the current-increase setting signal CPC. Thereby, overshooting in the locking-up waveform is positively controlled up to the time T3 at which the first phase inversion is detected.

When the first phase inversion is detected by the phase-inversion detecting circuit 81 at the time T3 and the detection signal Exa is output therefrom to the current-increase reference-signal generating circuit 82, the current-increase reference-signal generating circuit 82, similarly to the case where the counter-setting signal STBP was input thereto, generates the current-increase reference signal CNT based on the detection signal Exa, and outputs it to the current-increase setting-signal generating circuit 85. The current-increase setting-signal generating circuit 85, based on the current-increase reference signal CNT and the logical product output from the AND circuit 84, outputs the current-increase setting signal CPC at the time T31, and renders feedback-control operation based on the current-increase setting signal CPC.

When the first feedback control is rendered at the time T31 after the above-mentioned first phase inversion (at the time T3), feedback control of the PLL circuit by the increased current based on the current-increase setting signal CPC similar to the above is rendered at the times T32 and T33. Further, after the above-mentioned respective feedback controls are rendered, the charge pump 2 generates the output current Do only based on the phase-difference signals PP and PR similarly to the cases of the times T24 and T30, and the feedback control of the PLL circuit is rendered by this output current Do, when the phase-difference signals PP and PR are output at the times T34 and T40 from the phase comparator 1, until the second phase inversion is detected by the phase-inversion detecting circuit 81 at the time T4.

Thus, also during the interval from the first phase inversion at the time T3 to the second phase inversion at the time T4, similarly to the case of the interval between T2 and T3, the output current Do of the charge pump 2 is generated depending on the current-increase setting signal CPC with the increased current and the feedback control of the PLL circuit is rendered based thereon only in the former part. Accordingly, it is possible to control overshooting from the tarter lock frequency fvco2 of the channel switching to the utmost.

Feedback control of the PLL circuit after the second phase inversion is rendered based on the output current Do generated by the charge pump 2 only based on the phase-difference signals PP and PR.

Further, it is also possible that this feedback control of the PLL circuit is rendered based on the output current Do with the increased current which is generated by the charge pump 2 based on the current-increase setting signal CPC as well as the phase-difference signals PP and PR.

Further, in the above-described embodiment, the charge pump 2 is controlled by the current-increase setting signal CPC with the increased current in each of the cases of the first and second times the phase inversion is detected from the beginning of the locking-up. However, it is also possible that the charge pump 2 is controlled by the current-increase setting signal CPC with the, increased current only during the first interval of phase inversions or arbitrarily selected interval(s) of phase inversions.

The present invention is not limited to the above-described embodiment, and variations and modifications may be made without departing from the scope of the present invention.

The present application is based on Japanese priority applications No. 2000-221087, filed on Jul. 21, 2000, the entire contents of which are hereby incorporated by reference.

What is claimed is:

1. A PLL frequency synthesizer circuit comprising:

a voltage-controlled oscillator outputting a signal of a frequency controlled by an input voltage of an input signal, the output signal being used for feedback as an internal change signal;

a phase comparator detecting a phase difference between the internal change signal and an external reference signal; and a charge pump outputting an output current pulse of a length corresponding to the phase difference to a low-pass filter and providing via the low-pass filter the input signal having the input voltage corresponding to the phase difference to said voltage-controlled oscillator, said charge pump being controlled so that the input voltage of the input signal becomes a voltage for oscillating a lock frequency; and a current-increase control circuit controlling an absolute value of the output current pulse of said charge pump when a changing instruction of the lock frequency is input and/or when a phase inversion of the internal change signal in a locking-up operation is rendered in response to the changing instruction, wherein said current-increase control circuit sets a first value as the absolute value of the output current pulse during a predetermined interval after the locking-up operation is started and sets a second value smaller than said first value as the absolute value of the output current pulse after the predetermined interval has elapsed.

2. The PLL frequency synthesizer circuit as claimed in claim 1, further comprising an increase-setting part setting the number of times said charge pump outputs the output current pulse with the absolute value thereof being the first value during an interval from the time the changing instruction is input to the time the phase inversion is detected, and/or during an interval from the phase inversion and a subsequent phase inversion, wherein the predetermined interval is determined according to the number of times set by said increase-number setting part.

3. The PLL frequency synthesizer circuit as claimed in claim 1, further comprising an increased-current setting part setting a current-increase rate by which the absolute value of the output current pulse of said charge pump is thus increased, wherein the first value is determined according to the current-increase rate set by said increased-current setting part.

* * * * *